United States Patent
Zhou et al.

(10) Patent No.: US 9,865,659 B2
(45) Date of Patent: Jan. 9, 2018

(54) LIGHT EMITTING DEVICE INCLUDING TANDEM STRUCTURE

(71) Applicant: SAMSUNG ELECTRONICS CO., LTD., Suwon-si (KR)

(72) Inventors: Zhaoqun Zhou, Bridgewater, NJ (US); Peter T. Kazlas, Sudbury, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/644,668

(22) Filed: Mar. 11, 2015

(65) Prior Publication Data

US 2016/0079316 A1    Mar. 17, 2016

Related U.S. Application Data

(63) Continuation of application No. PCT/US2013/059432, filed on Sep. 12, 2013.

(Continued)

(51) Int. Cl.
*H01L 27/32* (2006.01)
*H01L 51/52* (2006.01)
(Continued)

(52) U.S. Cl.
CPC .......... *H01L 27/3225* (2013.01); *H01L 33/06* (2013.01); *H01L 51/5044* (2013.01);
(Continued)

(58) Field of Classification Search
CPC . H01L 27/3225; H01L 51/5088; H01L 33/06; H01L 51/5056; H01L 51/5278;
(Continued)

(56) References Cited

U.S. PATENT DOCUMENTS

| 2006/0196375 A1 | 9/2006 | Coe-Sullivan et al. |
| 2007/0103068 A1 | 5/2007 | Bawendi et al. |

(Continued)

FOREIGN PATENT DOCUMENTS

| KR | 20100095875 A | 9/2010 |
| KR | 20120029096 A | 3/2012 |

(Continued)

OTHER PUBLICATIONS

Bae, et al., "Gram-Scale One-Pot Synthesis of Highly Luminescent Blue Emitting Cd1-xZnxS/ZnS Nanocrystals" Chem. Mater. 2008, vol. 20, 5307-5313.

(Continued)

*Primary Examiner* — Michael Jung
*Assistant Examiner* — Charles R Peters
(74) *Attorney, Agent, or Firm* — Cantor Colburn LLP

(57) ABSTRACT

A light emitting device comprising: a pair of electrodes; two or more light emitting elements disposed between the electrodes in a stacked arrangement, wherein a light emitting element comprises a layer comprising an emissive material; and a charge generation element disposed between adjacent light emitting elements in the stacked arrangement, the charge generation element comprising a first layer comprising an inorganic n-type semiconductor material, and a second layer comprising a hole injection material. A charge generation element is also disclosed.

17 Claims, 5 Drawing Sheets

Related U.S. Application Data

(60) Provisional application No. 61/701,379, filed on Sep. 14, 2012.

(51) Int. Cl.
*H01L 33/06* (2010.01)
*H01L 51/50* (2006.01)

(52) U.S. Cl.
CPC ...... *H01L 51/5056* (2013.01); *H01L 51/5088* (2013.01); *H01L 51/5278* (2013.01); *H01L 51/502* (2013.01); *H01L 2251/5369* (2013.01)

(58) Field of Classification Search
CPC ......... H01L 51/5044; H01L 2251/5369; H01L 51/502
See application file for complete search history.

(56) References Cited

U.S. PATENT DOCUMENTS

| | | | |
|---|---|---|---|
| 2008/0001167 A1 | 1/2008 | Coe-Sullivan et al. | |
| 2008/0297045 A1* | 12/2008 | Cok | B82Y 20/00 313/506 |
| 2010/0044635 A1 | 2/2010 | Breen et al. | |
| 2011/0140075 A1* | 6/2011 | Zhou | B82Y 20/00 257/13 |
| 2012/0012820 A1* | 1/2012 | Endo | H01L 51/5278 257/40 |
| 2012/0098012 A1* | 4/2012 | Kim | H01L 27/3209 257/98 |
| 2012/0138894 A1 | 6/2012 | Qian et al. | |

FOREIGN PATENT DOCUMENTS

| | | |
|---|---|---|
| WO | 2007117698 A2 | 10/2007 |
| WO | 2007143197 A2 | 12/2007 |
| WO | 2009035657 A1 | 3/2009 |
| WO | 2009099425 A2 | 8/2009 |
| WO | 2010014198 A1 | 2/2010 |
| WO | 2011044391 A1 | 4/2011 |
| WO | 2011060180 A1 | 5/2011 |

OTHER PUBLICATIONS

Blochwitz, et al., "Interface electgronic structure of organic semiconductors with controlled doping levels", Organic Electronics vol. 2 (2001), pp. 97-104.

Bulovic, et al. "Transparent light-emitting devices", Nature, vol. 380 (1996) p. 29.

Chan, et al., "Contact potential difference measurements of doped organic molecular thin films", J. Vac. Sci. Technol. A 22(4), 2004 (5 pages).

Dabbousi et al., "(CdSe)AnS Core-Shell Quantum Dots: Synthesis and Characterization of a Size Series of Highly Luminescent Nanocrystallites"; J. Phys. Chem. B.; 1997; 101; 9463-9475.

Gu, et al., "Transparent organic light emitting devices" Appl. Phys. Lett. 1996, vol. 68, 2606-2608.

Ichikawa, et al., "Bipyridyl oxadiazoles as efficient and durable electron-transporting and hole-blocking molecuar materials", J. Mater. Chem. 2006, vol. 16, pp. 221-225.

International Preliminary Report on Patentability dated Mar. 17, 2015; International Application No. PCT/US2013/059432; International Filing Date Sep. 12, 2013 (8 pages).

International Search Report dated Jun. 26, 2014; International Application No. PCT/US2013/059432; International Filing Date Sep. 12, 2013 (4 pages).

Murray et al., "Synthesis and Characterization of Monodisperse Nanocrystals and Close-Packed Nanocrystal Assemblies"; Annu. Rev. Mater. Sci.; 2000; 30; 545-610.

Schmechel, "A theoretical approach to the hopping transport in p-doped zinc-phthalocyanine" 48. Internationales Wissenschaftliches Kolloquium Technische Universitat Ilmenau Sep. 22-25, 2003.

Written Opinion dated Jun. 26, 2014; International Application No. PCT/US2013/059432; International Filing Date Sep. 12, 2013 (7 pages).

Zhong, et al., "Alloyed ZnxCd1-xS Nanocrystals with Highly Narrow Luminescence Spectral Width", J. Am. Chem. Soc. 2003, vol. 125, 13559-13563.

* cited by examiner

LIGHT EMITTING DEVICE INCLUDING TANDEM STRUCTURE

This application is a continuation of International Application No. PCT/US2013/059432, filed 12 Sep. 2013, which was published in the English language as International Publication No. WO 2014/088667 on 12 Jun. 2014, which International Application claims priority to U.S. Provisional Patent Application No. 61/701,379, filed on 14 Sep. 2012. Each of the foregoing is hereby incorporated herein by reference in its entirety for all purposes.

FEDERALLY SPONSORED RESEARCH OR DEVELOPMENT

This invention was made with Government support under Contract No. 2004*H838109*000 awarded by the Central Intelligence Agency. The Government has certain rights in the invention.

TECHNICAL FIELD OF THE INVENTION

The present invention relates to the technical field of light emitting devices and components thereof.

SUMMARY OF THE INVENTION

The present invention relates to a charge generation element and a light emitting device including two or more light emitting elements with a charge generation element between two adjacent light emitting elements.

In accordance with one aspect of the present invention, there is provided a light emitting device comprising: a pair of electrodes; two or more light emitting elements disposed between the electrodes in a stacked arrangement, wherein a light emitting element comprises a layer comprising an emissive material; and a charge generation element disposed between adjacent light emitting elements in the stacked arrangement, the charge generation element comprising a first layer comprising an inorganic n-type semiconductor material and a second layer comprising a hole injection material.

A light emitting element can include a layer comprising an emissive material comprising quantum dots.

A light emitting element can include a layer comprising an emissive material comprising an organic electroluminescent material.

A light emitting device can include one or more light emitting elements that include a layer comprising an emissive material comprising quantum dots and one or more light emitting elements that include an organic electroluminescent material.

In embodiments including a light emitting element including a layer comprising an emissive material comprising quantum dots, such layer comprising quantum dots can be contiguous to the first layer of the charge generation element.

A light emitting element included in the light emitting device can emit light having a wavelength that is the same as or different from that emitted by another light emitting element included in the device.

An inorganic n-type semiconductor material can inject electrons into a light emitting element adjacent the first layer of the charge generation element.

A hole injection material can inject holes into a light emitting element adjacent the second layer of the charge generation element.

A light emitting element can further include one or more additional functional layers.

A light emitting device can further include one or more additional functional layers.

In accordance with another aspect of the present invention there is provided a charge generation element comprising a first layer comprising an inorganic n-type semiconductor material and a second layer comprising a hole injection material.

In the various aspects and embodiments of the inventions described herein, a charge generation element can include an inorganic n-type semiconductor material that can inject electrons into a light emitting element adjacent the first layer of the charge generation element. Examples of inorganic n-type semiconductor materials comprise n-type semiconductor materials comprising a Group II-VI compound, a Group III-V compound, a Group IV-VI compound, a Group I-III-VI compound, a Group II-IV-VI compound, a Group II-IV-V compound, a Group IV element, an alloy including any of the foregoing, and/or a mixture including any of the foregoing.

Preferably, the inorganic n-type semiconductor material comprises nanoparticles of the inorganic n-type semiconductor material.

In the various aspects and embodiments of the inventions described herein, a charge generation element can include a hole injection layer comprising a material that can inject holes into a light emitting element adjacent the second layer of the charge generation element. Examples of hole injection materials comprise known organic and/or inorganic hole injection materials. Such materials are readily identifiable by one of ordinary skill in the relevant art.

In the various aspects and embodiments of the inventions described herein, a charge generation element is preferably at least 50% transparent to the passage of light therethrough.

In the various aspects and embodiments of the inventions described herein, unless otherwise expressly provided, each layer can comprise one or more sublayers and each layer or sublayer can comprise one or more materials.

The foregoing, and other aspects described herein, all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed.

Other embodiments will be apparent to those skilled in the art from consideration of the description and drawings, from the claims, and from practice of the invention disclosed herein.

BRIEF DESCRIPTION OF THE DRAWINGS

In the drawings:

FIG. 1 depicts a diagram of an example of an embodiment of the present invention including a stacked arrangement of two light emitting elements with a charge generation element in between.

Figure 1:
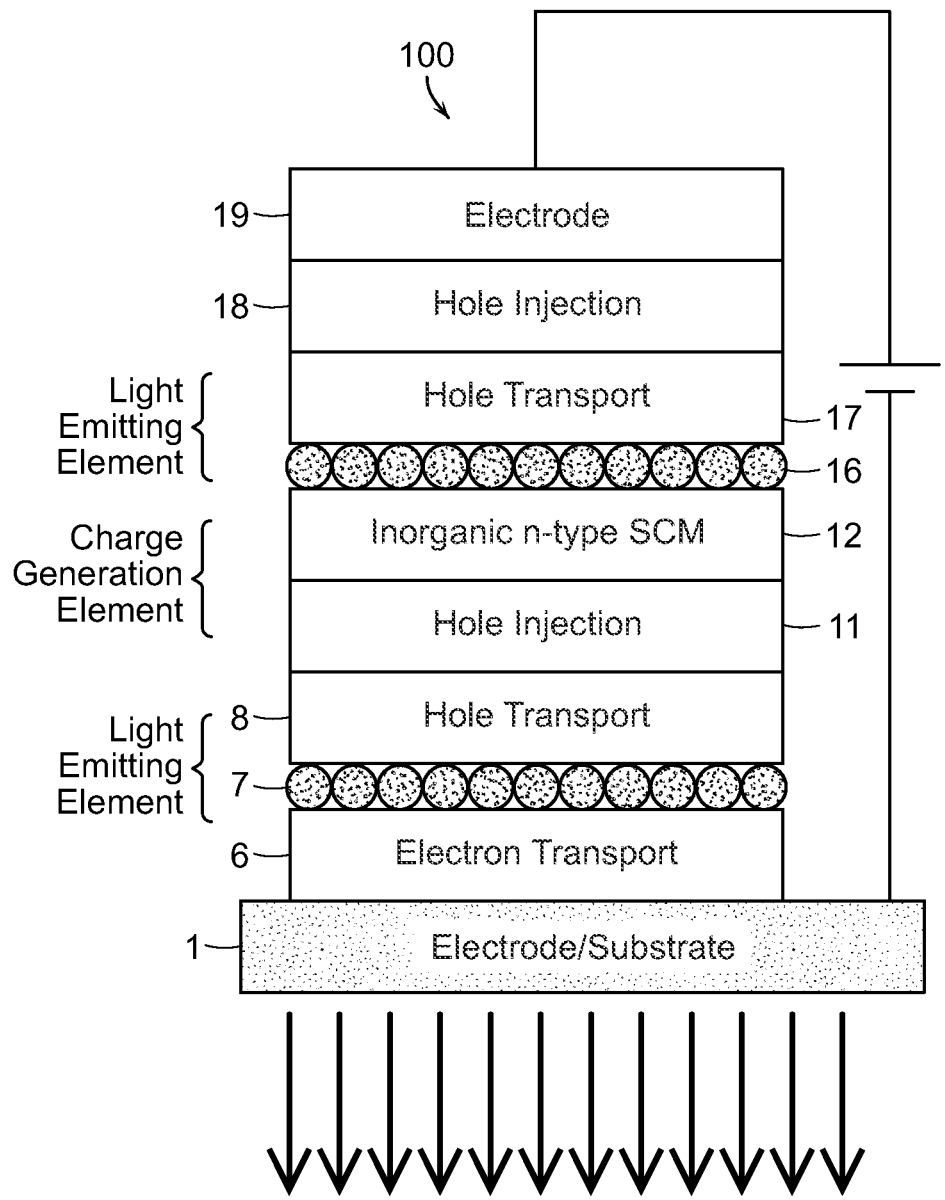

The attached figures provide a simplified representation presented for purposes of illustration only; actual structures may differ in numerous respects, including, e.g., relative scale, etc.

For a better understanding to the present invention, together with other advantages and capabilities thereof, reference is made to the following disclosure and appended claims in connection with the above-described drawings.

DETAILED DESCRIPTION OF THE INVENTION

Various aspects and embodiments of the present inventions will be further described in the following detailed description.

In accordance with one aspect of the present invention there is provided a charge generation element comprising a first layer comprising an inorganic n-type semiconductor material and a second layer comprising a hole injection material.

A charge generation element can be useful in a light emitting device including two or more light emitting structures in a stacked arrangement (also referred to herein as a tandem structure) between a pair of electrodes, wherein a charge generation element is disposed between two adjacent light emitting structures. The first layer of the charge generation element can inject electrons into the light emitting structure (or light emitting element) adjacent the first layer and the second layer can inject holes into the light emitting structure adjacent the second layer of the charge generation element.

Charge generation element(s) can facilitate improvement in the luminance efficiency (Cd/A) of a tandem structure light emitting device including same compared to a device including a single light emitting element between two electrodes.

A lifetime benefit can also be obtained in a tandem structure light emitting device including charge generation element between adjacent light emitting structures.

Further, by stacking multiple emitting elements in one device, current short/leakage path can be reduced.

A charge generation element is preferably at least 50% transparent to the passage of light, including, for example, at least 60% transparent to the passage of light, at least 70% transparent to the passage of light, at least 80% transparent to the passage of light, at least 90% transparent to the passage of light, at least 95% up to 100% transparent to the passage of light.

Inorganic n-type semiconductor materials that can be included in a first layer are known.

An inorganic n-type semiconductor material can comprise n-type semiconductor material comprising a Group II-VI compound, a Group III-V compound, a Group IV-VI compound, a Group I-III-VI compound, a Group II-IV-VI compound, a Group II-IV-V compound, a Group IV element, an alloy including any of the foregoing, and/or a mixture including any of the foregoing.

Examples of inorganic semiconductor materials include, but are not limited to, a Group II-chalcogenide (such as a metal oxide, a metal sulfide, a metal selenide, a metal telluride), a Group III-pnictide (such as a metal nitride, a metal phosphide, a metal arsenide, or metal arsenide), or elemental semiconductor. For example, an inorganic semiconductor material can include, without limitation, zinc oxide, a titanium oxide, a niobium oxide, an indium tin oxide, copper oxide, nickel oxide, vanadium oxide, chromium oxide, indium oxide, tin oxide, gallium oxide, manganese oxide, iron oxide, cobalt oxide, aluminum oxide, thallium oxide, silicon oxide, germanium oxide, lead oxide, zirconium oxide, molybdenum oxide, hafnium oxide, tantalum oxide, tungsten oxide, cadmium oxide, iridium oxide, rhodium oxide, ruthenium oxide, osmium oxide, zinc sulfide, zinc selenide, zinc telluride, cadmium sulfide, cadmium selenide, cadmium telluride, mercury sulfide, mercury selenide, mercury telluride, silicon carbide, diamond (carbon), silicon, germanium, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, lead telluride, iron sulfide, indium selenide, indium sulfide, indium telluride, gallium sulfide, gallium selenide, gallium telluride, tin selenide, tin telluride, tin sulfide, magnesium sulfide, magnesium selenide, magnesium telluride, barium titanate, barium zirconate, zirconium silicate, yttria, silicon nitride, and a mixture of two or more thereof.

An inorganic n-type semiconductor material can include an n-type dopant.

Examples of n-dopants for use in an inorganic semiconductor material taught herein include, but are not limited to, indium, aluminum, and gallium. As the skilled artisan will recognize other n-dopants can also be used.

An example of a preferred inorganic n-type semiconductor material for inclusion in a charge generation element comprises n-type zinc oxide. In certain embodiments, zinc oxide can be mixed or blended with one or more other inorganic materials, e.g., inorganic semiconductor materials, such as titanium oxide.

Other examples of inorganic n-type semiconducting materials include titanium oxide and indium phosphide.

Inorganic n-type semiconductor materials in the form of nanoparticles can be preferred for inclusion in the first layer of the charge generation element.

Preferably such nanoparticles are non-light-emitting.

In certain embodiments, it may be desirable that the surfaces of the nanoparticles are not passivated. For example, it may be desirable that the nanoparticles not include surface ligands or other surface passivation treatment.

Inorganic semiconductor nanoparticles can be prepared by known techniques, including, but not limited to, by a colloidal solution process.

Such nanoparticles can have an average particle size less than 20 nm. For example, the average particle size can be less than 10 nm, less than 5 nm, less than 4 nm, less than 2 nm. In certain embodiments, the nanoparticles can have an average particle size in a range from about 2 to about 6 nm. Other sizes may also be determined by the skilled art to be useful and/or desirable. In certain embodiments, a uniform or substantially uniform nanoparticle size may be desirable. In certain embodiments, a nonuniform nanoparticle size may be desirable.

A layer comprising nanoparticles of an inorganic material can be prepared, for example, by forming a layer from a dispersion of the nanoparticles in a liquid and removing the liquid. The liquid can be removed by evaporation, heat, or other technique identified by the skilled artisan. A preferred liquid is one in which the nanoparticles are not altered so as to change the composition or size thereof in a way that is not intended or desired.

Inorganic semiconductor materials can be deposited at a low temperature, for example, by a known method, such as a vacuum vapor deposition method, an ion-plating method, sputtering, inkjet printing, sol-gel, etc. For example, sputtering is typically performed by applying a high voltage across a low-pressure gas (for example, argon) to create a plasma of electrons and gas ions in a high-energy state. Energized plasma ions strike a target of the desired coating material, causing atoms from that target to be ejected with enough energy to travel to, and bond with, the substrate. Other techniques for depositing inorganic semiconductor materials can also be used.

A charge generation element also includes a second layer comprising a hole injection material.

A hole injection material is a material capable of injecting holes.

Hole-injection materials are known. Examples of hole injection materials comprise known organic and/or inorganic hole injection materials, readily identifiable by one of ordinary skill in the relevant art.

A hole-injection material can be inorganic or organic.

Examples of organic hole injection materials include, but are not limited to, LG-101 (see, for example, paragraph [0024] of EP 1 843 411 A1) and other hole injection materials available from LG Chem, LTD. Other organic hole injection materials can be used. For example, a hole injection material can comprise a comprise a hole transport layer that has been doped, preferably p-type doped. Examples of p-type dopants include, but are not limited to, stable, acceptor-type organic molecular material, which can lead to an increased hole conductivity in the doped layer, in comparison with a non-doped layer. In certain embodiments, a dopant comprising an organic molecular material can have a high molecular mass, such as, for example, at least 300 amu. Examples of dopants include, without limitation, $F_4$-TCNQ, $FeCl_3$, etc. Examples of doped organic materials for use as a hole injection material include, but are not limited to, an evaporated hole transport material comprising, e.g., 4,4',4"-tris(diphenylamino)triphenylamine (TDATA) that is doped with tetrafluoro-tetracyano-quinodimethane ($F_4$-TCNQ); p-doped phthalocyanine (e.g., zinc-phthalocyanine (ZnPc) doped with $F_4$-TCNQ (at, for instance, a molar doping ratio of approximately 1:30); N,N'-diphenyl-N,N'-bis(1-naphthyl)-1,1'biphenyl-4,4"diamine (alpha-NPD) doped with $F_4$-TCNQ. See J. Blochwitz, et al., "Interface Electronic Structure Of Organic Semiconductors With Controlled Doping Levels", *Organic Electronics* 2 (2001) 97-104; R. Schmechel, 48, Internationales Wissenschaftliches Kolloquium, Technische Universtaat Ilmenau, 22-25 Sep. 2003; C. Chan et al., "Contact Potential Difference Measurements Of Doped Organic Molecular Thin Films", *J. Vac. Sci. Technol. A* 22(4), July/August 2004. The disclosures of the foregoing papers are hereby incorporated herein by reference in their entireties. See also, Examples of p-type doped inorganic hole transport materials are described in U.S. Patent Application No. 60/653,094 entitled "Light Emitting Device Including Semiconductor Nanocrystals, filed 16 Feb. 2005, which is hereby incorporated herein by reference in its entirety. Examples of p-type doped organic hole transport materials are described in U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

Examples of inorganic hole injection materials are known and can be readily identified by the person of ordinary skill in the art. Molybdenum oxide is an example of an inorganic hole injection materials that may be preferred.

In accordance with another aspect of the present invention, there is provided a light emitting device comprising: a pair of electrodes; two or more light emitting elements disposed between the electrodes in a stacked arrangement, wherein a light emitting element comprises a layer comprising an emissive material; and a charge generation element disposed between adjacent light emitting elements in the stacked arrangement, the charge generation element comprising a first layer comprising an inorganic n-type semiconductor material and a second layer comprising a hole injection material.

FIG. 1 provides a cross-sectional view of a schematic representation of an example of a light-emitting device according to one embodiment of the present invention. While the depicted example has an inverted structure (e.g., the negative electrode or cathode is placed in contact with the substrate), the present invention also applies to a light emitting device having a non-inverted structure (e.g., the positive electrode or anode is place in contact with the substrate). Referring to FIG. 1, the light-emitting device 100 includes (from bottom to top) a first electrode (e.g., a cathode)/substrate combination 1, a first light emitting element comprising a layer comprising a material capable of transporting charge (depicted as a material capable of transporting electrons, which is also referred to herein as a "electron transport material") 6, an emissive layer comprising an emissive material (e.g., quantum dots) 7, a layer comprising a material capable of transporting charge (depicted as a material capable of transporting holes, which is also referred to herein as a "hole transport material") 8, a charge generation element comprising a second layer comprising a hole injection material 11 (adjacent the hole transport layer of the first light emitting element) and a first layer comprising an inorganic n-type semiconductor material 12, a second light emitting element comprising a layer comprising an emissive material (e.g., quantum dots) 16, and a layer comprising a hole transport material 17.

The depicted light-emitting device 100 also includes a hole injection layer 18 between the uppermost light emitting element and the second electrode (e.g., an anode) 19. The inclusion of such hole injection layer is optional, but may be desirable depending upon the electrode material and the particular material included in the adjacent layer of the uppermost light emitting element.

A light emitting element includes at least a layer comprising an emissive material. A light emitting element can further include one or more additional layers.

In certain embodiments, the light emitting device can further include more than two light emitting elements in the stacked arrangement with a charge generation element between any two light adjacent emitting elements.

A substrate can be opaque or transparent. A transparent substrate can be used, for example, in the manufacture of a transparent light emitting device, as shown in the FIG. 1. See, for example, Bulovic, V. et al., Nature 1996, 380, 29; and Gu, G. et al., Appl. Phys. Lett. 1996, 68, 2606-2608, each of which is incorporated by reference in its entirety.

Transparent substrates including patterned ITO are commercially available and can be used in making a device according to the present invention as shown in FIG. 1.

A substrate can be rigid or flexible. For example, a substrate can be plastic, metal, semiconductor wafer, or glass. A substrate can be a substrate commonly used in the art. Preferably a substrate has a smooth surface. A substrate surface free of defects is particularly desirable.

One electrode can be, for example, an anode comprising a high work function (e.g., greater than 4.0 eV) hole-injecting conductor, such as an indium tin oxide (ITO) layer. Other anode materials include other high work function hole-injection conductors including, but not limited to, for example, tungsten, nickel, cobalt, platinum, palladium and their alloys, gallium indium tin oxide, zinc indium tin oxide, titanium nitride, polyaniline, or other high work function hole-injection conducting polymers. An electrode can be light transmissive or transparent. In addition to ITO, examples of other light-transmissive electrode materials include conducting polymers, and other metal oxides, low or high work function metals, conducting epoxy resins, or carbon nanotubes/polymer blends or hybrids that are at least partially light transmissive. An example of a conducting polymer that can be used as an electrode material is poly (ethlyendioxythiophene), sold by Bayer AG under the trade mark PEDOT. Other molecularly altered poly(thiophenes) are also conducting and could be used, as well as emaraldine salt form of polyaniline.

The other electrode can be, for example, a cathode comprising a low work function (e.g., less than 4.0 eV), electron-injecting, metal, such as Al, Ba, Yb, Ca, a lithium-aluminum alloy (Li:Al), a magnesium-silver alloy (Mg:Ag), or lithium fluoride-aluminum (LiF:Al). Other examples of cathode materials include silver, gold, ITO, etc. An electrode, such as Mg:Ag, can optionally be covered with an opaque protective metal layer, for example, a layer of Ag for protecting the cathode layer from atmospheric oxidation, or a relatively thin layer of substantially transparent ITO.

An electrode can be sandwiched, sputtered, or evaporated onto the exposed surface of the solid layer.

One or both of the electrodes can be patterned.

The electrodes of the device can be connected to a voltage source by electrically conductive pathways.

In certain aspects and embodiments of the inventions described herein, the substrate, electrode (e.g., anode or cathode) materials and other materials included in a device are selected based on light transparency characteristics. For example, a device comprising a light-emitting device, such selection can enable preparation of a device that emits light from the top surface thereof. A top emitting device can be advantageous for constructing an active matrix device (e.g., a display). In another example, such selection can enable preparation of a device that emits light from the bottom surface thereof. In yet another example, such selection can enable preparation of a device that is transparent on both sides (e.g., fully transparent). Preferably an emitting side is at least 50% transparent. As the skilled artisan will appreciate, higher transparency can be more preferable.

In a light-emitting device, electroluminescence can be produced by the emissive material included in the device when a voltage of proper polarity is applied across the device.

As shown in FIG. 1, the first electrode 1 can be a cathode. As discussed above, a cathode can comprise a material that can easily inject electrons. Examples include, but are not limited to, ITO, aluminum, silver, gold, etc. Other suitable cathode materials are known and can be readily ascertained by the skilled artisan. The electrode material can be deposited using any suitable technique. In certain embodiments, the anode can be patterned. Alternatively, the first electrode can be an anode, with the other electrode being the cathode.

As described above, a light emitting element comprises a layer comprising an emissive material. An emissive layer can be patterned or unpatterned.

A layer comprising an emissive material can comprise one or more layers of the same or different emissive material(s).

In certain embodiments, the emissive layer can have a thickness in a range from about 1 nm to about 20 nm. In certain embodiments, the emissive layer can have a thickness in a range from about 1 nm to about 10 nm. In certain embodiments, the emissive layer can have a thickness in a range from about 3 nm to about 6 about nm. In certain embodiments, the emissive layer can have a thickness of about 4 nm.

An emissive material can comprise quantum dots (which quantum dots may further include ligands attached thereto). Quantum dots and ligands are further discussed below.

An emissive material can comprise one or more different types of quantum dots, wherein each type can be selected to emit light having a predetermined wavelength. In certain embodiments, quantum dot types can be different based on, for example, factors such composition, structure and/or size of the quantum dot.

Emissive materials that emit light having different wavelengths can be included in a single layer and/or in separate layers.

Quantum dots can be selected to emit at any predetermined wavelength across the electromagnetic spectrum.

Different types of quantum dots that have emissions at the same and/or different wavelengths can be utilized.

In certain embodiments, quantum dots can be capable of emitting visible light.

In certain embodiments, quantum dots can be capable of emitting infrared light.

The color of the light output of an emissive material comprising quantum dots can be controlled by the selection of the composition, structure, and size of the quantum dots included in the emissive material.

An emissive material can comprise an organic electroluminescent material. Examples of organic electroluminescent materials include those used or suitable for use as the emissive material in an organic light emitting device (OLED). Such organic electroluminescent materials can be readily ascertained by those of ordinary skill in the relevant art.

An emissive material can comprise a combination of quantum dots and one or more organic electroluminescent materials in a mixed and/or layered arrangement.

A light emitting device in accordance with the present invention can include one or more light emitting elements including an emissive material comprising quantum dots and one or more light emitting elements including an emissive material comprising an organic electroluminescent material.

A light emitting device in accordance with the present invention can include two or more light emitting elements wherein each of the light emitting elements includes an emissive material comprising quantum dots.

A light emitting device in accordance with the present invention can include two or more light emitting elements wherein each of the light emitting elements includes an emissive material comprising an organic electroluminescent material.

Preferably, at least one of the light emitting elements includes an emissive material comprising quantum dots.

A light emitting element can further include one or more layers including a charge transport material (e.g., a layer comprising an electron transport material (also referred to herein as an electron transport layer) and/or a layer comprising a hole transport material (also referred to herein as a hole transport material)).

For example, as shown in FIG. 1, the first light emitting element 5 includes a layer including an emissive material sandwiched between an electron transport layer and a hole transport layer (preferably including a hole transport material comprising a spiro-compound); and the second light emitting element 15 includes a layer comprising the emissive material and a hole transport layer. (If a hole transport layer in a light emitting element adjacent the hole generation electrode comprises a material with both hole injection and hoe transport capability it can serve the function of both a hole transport layer and a hole injection layer in a single layer.)

A light emitting element can further include additional features (e.g., additional layers).

Advantageously, the inorganic n-type semiconductor material included in a charge generation element in accordance with the present invention can also serve as an electron transport layer for the light emitting element contiguous thereto.

Hole transport and electron transport materials can be collectively referred to as charge transport materials. Either or both of these materials can comprise organic or inorganic materials. Examples of inorganic materials include, for example, inorganic semiconductors. Such inorganic material can be amorphous or polycrystalline. An organic charge transport material can be polymeric or non-polymeric.

Organic hole transport materials are known. An example of an organic material that can be included in a hole transport layer includes an organic chromophore. The organic chromophore can include a phenyl amine, such as, for example, N,N'-diphenyl-N,N'-bis(3-methylphenyl)-(1,1'-biphenyl)-4,4'-diamine (TPD). Other hole transport layer can include (N,N'-bis(3-methylphenyl)-N,N'-bis(phenyl)-spiro (spiro-TPD), 4-4'-N,N'-dicarbazolyl-biphenyl (CBP), 4,4-.bis[N-(1-naphthyl)-N-phenylamino]biphenyl (NPD), etc., a polyaniline, a polypyrrole, a poly(phenylene vinylene), copper phthalocyanine, an aromatic tertiary amine or polynuclear aromatic tertiary amine, a 4,4'-bis(p-carbazolyl)-1,1'-biphenyl compound, N,N,N',N'-tetraarylbenzidine, poly(3,4-ethylenedioxythiophene) (PEDOT)/polystyrene para-sulfonate (PSS) derivatives, poly-N-vinylcarbazole derivatives, polyphenylenevinylene derivatives, polyparaphenylene derivatives, polymethacrylate derivatives, poly(9,9-octylfluorene) derivatives, poly(spiro-fluorene) derivatives, N,N'-di(naphthalene-1-yl)-N,N'-diphenyl-benzidine (NPB), tris(3-methylphenylphenylamino)-triphenylamine (m-MTDATA), and poly(9,9'-dioctylfluorene-co-N-(4-butylphenyl)diphenylamine (TFB), and spiro-NPB.

In certain preferred embodiments, a hole transport layer comprises an organic small molecule material, a polymer, a spiro-compound (e.g., spiro-NPB), etc.

In certain embodiments of the inventions described herein, a hole transport layer can comprise an inorganic material. Inorganic hole transport materials are known. Examples of inorganic materials include, for example, inorganic semiconductor materials capable of transporting holes. The inorganic material can be amorphous or polycrystalline. Examples of such inorganic materials and other information related to fabrication of inorganic hole transport materials that may be helpful are disclosed in International Application No. PCT/US2006/005184, filed 15 Feb. 2006, for "Light Emitting Device Including Semiconductor Nanocrystals, which published as WO 2006/088877 on 26 Aug. 2006, the disclosure of which is hereby incorporated herein by reference in its entirety.

Organic electron transport materials are known. An example of a typical organic material that can be included in an electron transport layer includes a molecular matrix. The molecular matrix can be non-polymeric. The molecular matrix can include a small molecule, for example, a metal complex. The metal complex of 8-hydoryquinoline can be an aluminum, gallium, indium, zinc or magnesium complex, for example, aluminum tris(8-hydroxyquinoline) ($Alq_3$). In certain embodiments, the electron transport material can comprise LT-N820 or LT-N821 (1,3-Bis[2-(2,2'-bypyridine-6-yl)-1,3,4-oxadiazo-5-yl]benzene (also abbreviated as Bpy-OXD), available from Luminescent Technologies, Taiwan. For additional information relating to Bpy-OXD, see M. Ichikawa et al., J. Mater. Chem., 2006, 16, 221-25, the disclosure of which is hereby incorporated herein by reference in its entirety. Other classes of materials in the electron transport layer can include metal thioxinoid compounds, oxadiazole metal chelates, triazoles, sexithiophenes derivatives, pyrazine, and styrylanthracene derivatives. An electron transport layer comprising an organic material may be intrinsic (undoped) or doped. Doping may be used to enhance conductivity. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

An electron transport material can comprise an inorganic material. Inorganic electron transport materials are known. Examples of inorganic materials include, for example, inorganic semiconductor materials capable of transporting holes. The inorganic material can be amorphous or polycrystalline. Examples of such inorganic materials and other information related to fabrication of inorganic hole transport materials that may be helpful are disclosed in International Application No. PCT/US2006/005184, filed 15 Feb. 2006, for "Light Emitting Device Including Semiconductor Nanocrystals, which published as WO 2006/088877 on 26 Aug. 2006, the disclosure of which is hereby incorporated herein by reference in its entirety.

A material having electron transport and electron injection capabilities can be included in a light emitting element as an electron transport material. A preferred example of such a material includes zinc oxide. Additional information about materials having electron transport and electron injection capabilities is described in U.S. Patent Application Publication No. 20110140075, published Jun. 16, 2011, of Zhou, et al., entitled "Light-Emitting Device Including Quantum Dots", which is hereby incorporated herein by reference.

Charge transport materials comprising, for example, an inorganic material such as an inorganic semiconductor material, can be deposited at a low temperature, for example, by a known method, such as a vacuum vapor deposition method, an ion-plating method, sputtering, inkjet printing, sol-gel, etc. Other techniques can also be used.

Organic charge transport materials may be deposited by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., ≤$10^{-8}$ torr), high vacuum (e.g., from about $10^{-8}$ torr to about $10^{-5}$ torr), or low vacuum conditions (e.g., from about $10^{-5}$ torr to about $10^{-3}$ torr). Other techniques can also be used.

Charge transport materials comprising organic materials and other information related to fabrication of organic charge transport layers that may be helpful are disclosed in U.S. patent application Ser. No. 11/253,612 for "Method And System For Transferring A Patterned Material", filed 21 Oct. 2005, and Ser. No. 11/253,595 for "Light Emitting Device Including Semiconductor Nanocrystals", filed 21 Oct. 2005, each of which is hereby incorporated herein by reference in its entirety.

A charge transport material is preferably included in a light emitting element as a layer. In certain embodiments, the layer can have a thickness in a range from about 10 nm to about 500 nm.

As discussed above, a light emitting device can further include a layer comprising a hole-injection material between the hole generating electrode and an adjacent hole transport layer of a light emitting element. Hole injection materials are discussed elsewhere herein.

In certain embodiments, a layer comprising a spacer material (not shown) can be included between the emissive material and an adjacent layer. A layer comprising a spacer material can promote better electrical interface between the emissive layer and the adjacent layer. A spacer material may comprise an organic material or an inorganic material. In certain embodiments, a spacer material comprises parylene. Preferably, the spacer material comprises an ambipolar material. More preferably, it is non-quenching. In certain embodiments, for example, a spacer material between the emissive layer and a hole transport layer can comprise an ambipolar host or hole transport material, or nanoparticles such as nickel oxide, and other metal oxides.

A light emitting element can further optionally include one or more interfacial layers as described, for example, in International Application No. PCT/US2010/051867 of QD Vision, Inc., et al. entitled "Device Including Quantum Dots", which published as WO 2011/044391 on 14 Apr. 2011, which is hereby incorporated herein by reference in its entirety.

A charge generation element 10 comprises a first layer comprising an inorganic n-type semiconductor material and a second layer comprising a hole injection material.

Inorganic n-type semiconductor materials and hole injection materials useful in a charge generation element are discussed above.

Although FIG. 1 depicts an example of an embodiment of a light emitting device including two light emitting elements, as mentioned above, a light emitting device in accordance with the present invention can also comprise three or more light emitting elements that are stacked. When a charge generation element is provided between the pair of electrodes so as to partition adjacent light emitting elements in the stacked arrangement in the manner depicted in FIG. 1, the light emitting device is similarly expected to have an improved electroluminescent lifetime and luminance while keeping a low current density.

When the light emitting elements included in a light emitting device are capable of emitting light having different colors from each other, a composite light emission of a desired color can be obtained from the light emitting device. For example, in a light emitting device having two light emitting elements, the emission colors of the first light emitting element and the second light emitting element can be selected to emit a desired composite light color from the device. For example, composite white light can be obtained from a light emitting device including a blue light emitting element and a yellow light emitting element. Composite white light can also be obtained, for example, from a light emitting device including three light emitting elements (e.g., red, blue, and green). Other combinations of light emitting elements that emit light having preselected color light can be arranged in a stacked arrangement to provide other desired composite color output from the light emitting device. Selection of the colors of light to be emitted from the light emitting elements included in the tandem structure to obtain the desired composite color light from the device is within the skill of a person of ordinary skill in the relevant art.

As discussed above, a light emitting element is not limited to the example of the embodiment depicted in FIG. 1.

A light emitting device described herein can further include a passivation or other protective layer or coating that can be used to protect the device from the environment. For example, a protective glass layer can be included to encapsulate the device. Optionally a desiccant or other moisture absorptive material can be included in the device before it is sealed, e.g., with an epoxy, such as a UV curable epoxy. Other desiccants or moisture absorptive materials can be used.

A quantum dot is a nanometer sized particle that can have optical properties arising from quantum confinement. The particular composition(s), structure, and/or size of a quantum dot can be selected to achieve the desired wavelength of light to be emitted from the quantum dot upon stimulation with a particular excitation source. In essence, quantum dots may be tuned to emit light across the visible spectrum by changing their size. See C. B. Murray, C. R. Kagan, and M. G. Bawendi, *Annual Review of Material Sci.*, 2000, 30: 545-610 hereby incorporated by reference in its entirety.

A quantum dot can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 5, 6, 7, 8, 9, 10, 11, 12, 13, 14, 15, 16, 17, 18, 19, or 20 nm). In certain embodiments, quantum dots have an average particle size in a range from about 1 to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

For convenience, the size of quantum dots can be described in terms of a "diameter". In the case of spherically shaped quantum dots, diameter is used as is commonly understood. For non-spherical quantum dots, the term diameter can typically refer to a radius of revolution (e.g., a smallest radius of revolution) in which the entire non-spherical quantum dot would fit.

Preferably, a quantum dot comprises a semiconductor nanocrystal. In certain embodiments, a semiconductor nanocrystal has an average particle size in a range from about 1 to about 20 nm, and preferably from about 1 to about 10 nm. However, depending upon the composition, structure, and desired emission wavelength of the quantum dot, the average diameter may be outside of these ranges.

A quantum dot can comprise one or more semiconductor materials.

In certain preferred embodiments, the quantum dots comprise crystalline inorganic semiconductor material (also referred to as semiconductor nanocrystals). Examples of preferred inorganic semiconductor materials include, but are not limited to, Group II-VI compound semiconductor nanocrystals, such as CdS, CdSe, ZnS, ZnSe, ZnTe, HgS, HgSe, HgTe, and other binary, ternary, and quaternary II-VI compositions; Group III-V compound semiconductor nanocrystals, such as GaP, GaAs, InP and InAs; PbS; PbSe; PbTe, and other binary, ternary, and quaternary III-V compositions. Other non-limiting examples of inorganic semiconductor materials include Group II-VI compounds, Group III-V compounds, Group IV-VI compounds, Group I-III-VI compounds, Group II-IV-VI compounds, Group II-IV-V compounds, Group IV elements, an alloy including any of the foregoing, and/or a mixture including any of the foregoing.

A quantum dot can comprise a core comprising one or more semiconductor materials and a shell comprising one or more semiconductor materials, wherein the shell is disposed over at least a portion, and preferably all, of the outer surface of the core. A quantum dot including a core and shell is also referred to as a "core/shell" structure.

In a core/shell quantum dot, the shell or overcoating may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

In certain embodiments, more than one shell or overcoating can be included in a quantum dot.

In certain embodiments, the shell can be chosen so as to have an atomic spacing close to that of the "core" substrate. In certain other embodiments, the shell and core materials can have the same crystal structure.

Quantum dots can also have various shapes, including, but not limited to, sphere, rod, disk, other shapes, and mixtures of various shaped particles.

Preferably, the quantum dots include one or more ligands attached to the surface thereof. In certain embodiments, a ligand can include an alkyl (e.g., $C_1$-$C_{20}$) species. In certain embodiments, an alkyl species can be straight-chain, branched, or cyclic. In certain embodiments, an alkyl species can be substituted or unsubstituted. In certain embodiments, an alkyl species can include a hetero-atom in the chain or cyclic species. In certain embodiments, a ligand can include an aromatic species. In certain embodiments, an aromatic species can be substituted or unsubstituted. In certain embodiments, an aromatic species can include a hetero-atom. Additional information concerning ligands is provided herein and in various of the below-listed documents which are incorporated herein by reference.

By controlling the structure, shape and size of quantum dots during preparation, energy levels over a very broad range of wavelengths can be obtained while the properties of the bulky materials are varied. Quantum dots (including but not limited to semiconductor nanocrystals) can be prepared by known techniques. Preferably they are prepared by a wet chemistry technique wherein a precursor material is added to a coordinating or non-coordinating solvent (typically organic) and nanocrystals are grown so as to have an intended size. According to the wet chemistry technique, when a coordinating solvent is used, as the quantum dots are grown, the organic solvent is naturally coordinated to the surface of the quantum dots, acting as a dispersant. Accordingly, the organic solvent allows the quantum dots to grow to the nanometer-scale level. The wet chemistry technique has an advantage in that quantum dots of a variety of sizes can be uniformly prepared by appropriately controlling the concentration of precursors used, the kind of organic solvents, and preparation temperature and time, etc.

The emission from a quantum dot capable of emitting light (e.g., a semiconductor nanocrystal) can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light (e.g., semiconductor nanocrystals) can result in emission of light in a narrow spectral range. The population can be monodisperse preferably exhibits less than a 15% rms (root-mean-square) deviation in diameter of such quantum dots, more preferably less than 10%, most preferably less than 5%. Spectral emissions in a narrow range of no greater than about 75 nm, no greater than about 60 nm, no greater than about 40 nm, and no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

For example, semiconductor nanocrystals can have high emission quantum efficiencies such as greater than 10%, 20%, 30%, 40%, 50%, 60%, 70%, 80%, or 90%.

The narrow FWHM of semiconductor nanocrystals can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A pattern including more than one size of semiconductor nanocrystal can emit light in more than one narrow range of wavelengths. The color of emitted light perceived by a viewer can be controlled by selecting appropriate combinations of semiconductor nanocrystal sizes and materials. The degeneracy of the band edge energy levels of semiconductor nanocrystals facilitates capture and radiative recombination of all possible excitons.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

An emissive material can be deposited by spin-casting, screen-printing, inkjet printing, gravure printing, roll coating, drop-casting, Langmuir-Blodgett techniques, contact printing or other techniques known or readily identified by one skilled in the relevant art.

Preferably, a light-emitting device including an emissive material comprising a plurality of semiconductor nanocrystals is processed in a controlled (oxygen-free and moisture-free) environment, preventing the quenching of luminescent efficiency during the fabrication process.

The present invention will be further clarified by the following examples, which are intended to be exemplary of the present invention.

EXAMPLE

A. General Considerations

Unless stated otherwise, all synthetic manipulations were carried out using standard Schlenk techniques under a nitrogen atmosphere, or in an M-Braun glovebox under an atmosphere of purified nitrogen. Zinc acetate dihydrate (>98%; Aldrich), 2-methoxyethanol (>99%, Aldrich), tetramethylammonium hydroxide (TMAH, >97%, Aldrich), 2-ethanolamine (>98%, Aldrich), trioctylphosphine (TOP, >97%, Aldrich), trioctylphosphine oxide (TOPO, >99%, Aldrich), octadecylphosphonic acid (ODPA, PCI Synthesis), dimethylcadmium (CdMe$_2$, 97%, Strem), hexamethyldisilathiane (TMS$_2$S, Synthesis grade, Aldrich), and decylamine (98%, Aldrich) were used as received. Toluene, hexanes, 2-isopropanol, and methanol were purchased from Aldrich in 18-L Pure-Pac™ solvent delivery kegs and sparged vigorously with nitrogen prior to use. CdMe$_2$ and TMS$_2$S, due to their nature, should be handled with care.

B. Preparation of Inorganic n-Type ZnO Semiconducting Nanoparticles

The following procedure was done on the bench top under air. ZnO nanoparticles were synthesized by a modification of a known procedure. Zinc acetate dihydrate (3.00 g, 13.7 mmol) and 2-methoxyethanol (200 mL) were added to a flask equipped with a magnetic stirbar. In a separate vial, tetramethylammonium hydroxide (TMAH) (4.5 g, 25 mmol) and 2-methoxyethanol (20 mL) were combined. Both solutions were agitated vigorously until the reagents were dissolved. Under constant stirring, the TMAH solution was slowly added to the zinc acetate solution over 10 min. The solution was allowed to stir for an additional 1 min and demonstrated a pale blue-green emission when excited with UV light. 2-Ethanolamine (4 mL) was added to stabilize the particles.

The ZnO nanoparticles were purified by adding toluene (440 mL) and hexanes (220 mL) to the above mixture. The flocculates were isolated by centrifugation (3500 rpm; 1 min) and decanting the colorless supernatant. The colorless powder was redispersed in a mixture of 2-isopropanol (44 mL) and methanol (11 mL) and filtered through a syringe filter (0.2 μm). The dispersion was stored at −30° C.

C. Preparation of Quantum Dots (QDs) Capable of Emitting Blue Light

CdZnS/ZnS Core/Shell Preparation.

0.768 g CdO (99.9%, Aldrich) and 4.878 g ZnO (99.9%, Aldrich) were weighed into a three necked flask equipped with a condenser. To this was added: 43.2 mL tech grade oleic acid (Aldrich, vacuum-transferred prior to use) and 20 mL of tech grade 1-octadecene (ODE) (Aldrich). The content of the flask was degassed at 100° C. for 1 h in vacuo (10 millitorr).

Separately 0.288 g of sulfur (99.9%, Strem) was dissolved in 20 mL of tech grade ODE in a three necked flask by stirring and heating to 80° C. The contents of the flask were degassed at 80° C. for 1 h in vacuo (10 millitorr).

The contents of the flask containing Cd and Zn was heated to 300° C. under nitrogen for 1 h. This formed a milky suspension. The flask was heated to 310° C. and the contents of the flask containing the S/ODE were swiftly injected into the flask containing Cd and Zn. The temperature fell to 275° C. and climbed back to 310° C. in ~3 min. The flask containing the cores was heated for a total of 10 min.

The ZnS shell was grown in situ by swiftly injecting 18.0 mL of tri-n-butylphosphine sulfide (2.66 M, prepared by adding 6.8 g of sulfur to a stirred solution of 80 mL of tri-n-butylphosphine in a glove box over 2 h) at 310° C. This was heated for an additional 33 min. The contents of the flask were transferred to a degassed flask under nitrogen and transferred to an inert atmosphere box for further purification The cores including a ZnS shell were purified by precipitation as follows. The solution was divided into 12 parts and each part was added to a separate centrifuge tube. Butanol (ca. 25 mL) was added to each tube. Each tube was then centrifuged for 8 min, 4000 rpm. After centrifuging, the supernatant liquid was poured off, retaining the solid in each centrifuge tube. A total of ~15 mL of hexanes was used to disperse the solid. This was divided in half and added to separate centrifuge tubes. A total of 50 mL of butanol was added to the hexane dispersion. After mixing, each tube was centrifuged again. The supernatant liquid was decanted and the yellow solid was dispersed in a total 20 mL of hexanes. The dispersion was filtered through a 0.2 micron filter. (The overcoated cores are in the filtrate.)

Characterization of Above Prepared CdZnS/ZnS Core/Shell Nanocrystals

Maximum peak emission: 450 nm

FWHM 20 nm

Photoluminescence quantum efficiency ~75%

Additional information relating to preparation of quantum dots can be found in X. Zhong, Y. Feng, W. Knoll, and M. Han, "Alloyed Zn$_x$Cd$_{1-x}$S Nanocrystals with Highly Narrow Luminescence Spectral Width," *Journal of the American Chemical Society*, vol. 125, no. 44, pp. 13559-13563, November 2003, W. K. Bae, M. K. Nam, K. Char, and S. Lee, "Gram-Scale One-Pot Synthesis of Highly Luminescent Blue Emitting Cd$_{1-x}$Zn$_x$S/ZnS Nanocrystals," *Chemistry of Materials*, vol. 20, no. 16, pp. 5307-5313, August 2008, and U.S. Published Patent Application No. 2010/0044635, of Breen, et al., published 25 Feb. 2012, entitled "Blue Emitting Semiconductor Nanocrystals and Compositions And Devices Including Same", each of the foregoing being hereby incorporated herein by reference in its entirety.

Figure 5:
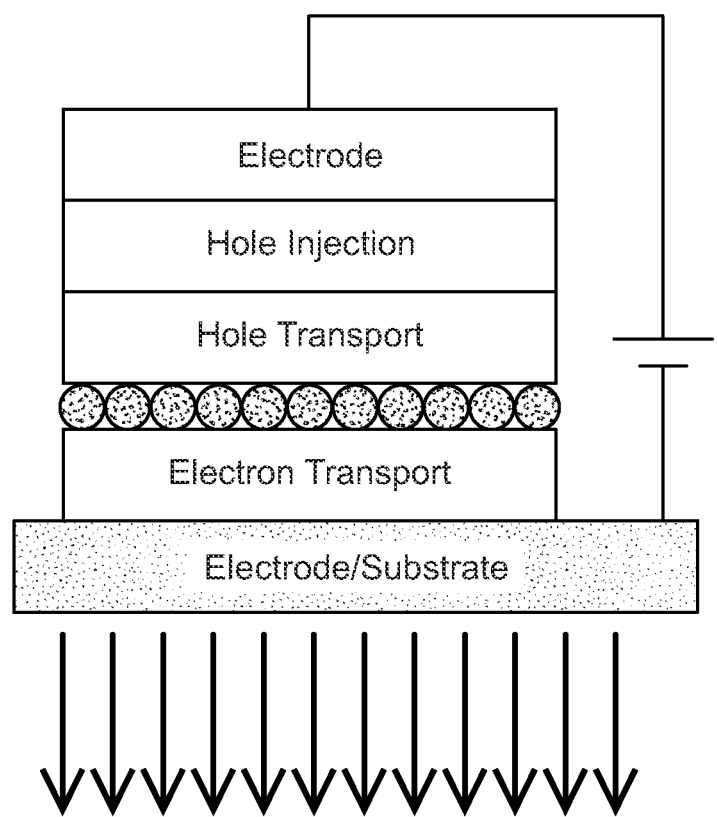
FIG. 5 depicts a diagram of an example of light emitting device without a tandem structure (and without a charge generation element).

D. QLED Fabrication Procedures (1) FIG. 5A shows an example of an inverted structure where the cathode is an ITO layer, followed by a solution-processed inorganic metal oxide (ZnO, 35 nm) as the electron-injection/transport layer followed by a solution-cast light-emitting quantum dot (QD) layer (e.g., with a thickness in a range of about 10 to about 15 nm). Next, the hole-transport (spiro-2NPB, e.g., with a thickness of about 50 nm) and hole injection layers (LG101, with a thickness of about 10 nm) are vapor deposited followed by the aluminum (Al) anode contact.

(2) FIG. 1 shows an example of an embodiment of a tandem blue light emitting device including two light emitting elements, each including an emissive material comprising quantum dots, and including a charge generation element between the two light emitting elements (a light emitting element may also be referred to as a cell). The device fabrication procedure is described as following: ZnO nanoparticles (prepared generally as described in this Example) is spun cast onto ITO as an electron injection layer and electron transport layer (e.g., with a thickness of about 35 nm), followed by forming a blue QD layer having a thickness in a range of about 10 to about 15 nm (as generally described above). Next, a layer comprising a hole-transport material (spiro-2NPB, with a thickness of about 50 nm) is vapor deposited above the QD layer. The hole injection layer of the charge generation element, comprising LG101, with a thickness of about 10 nm is next deposited over the hole transport layer by vapor deposition. A layer comprising inorganic n-type semiconductor material comprising ZnO nanoparticles is next formed on the hole injection layer as the other part of the charge generation element; the ZnO nanoparticle layer being spun cast on top of LG101. Next, a layer with a thickness in a range of about 10 to about 15 nm comprising blue QDs (prepared generally as described above) is spun cast on the LG101 layer, then capped by 50 nm of Spiro-2NPB and 10 nm of LG101. Finally, 150 nm of Al was vapor deposited on top of organic layer as anode. All devices are then sealed in a nitrogen atmosphere using a UV-curable epoxy.

Figure 2:
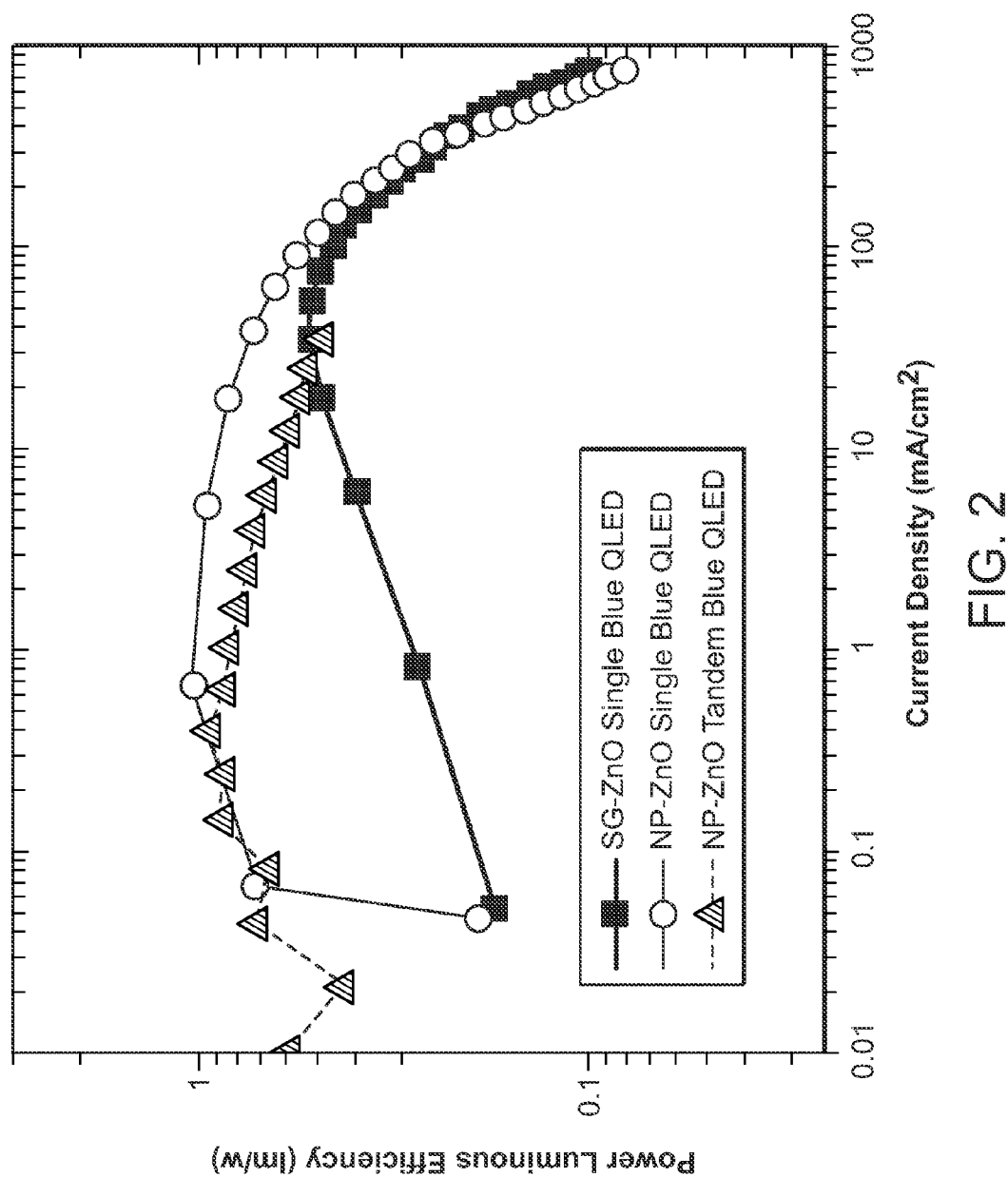
FIG. 2 provides a graphical representation of lumens/watt as a function of current density for two separate single devices and for an example of an embodiment of tandem device in accordance with the present invention.
Figure 3:
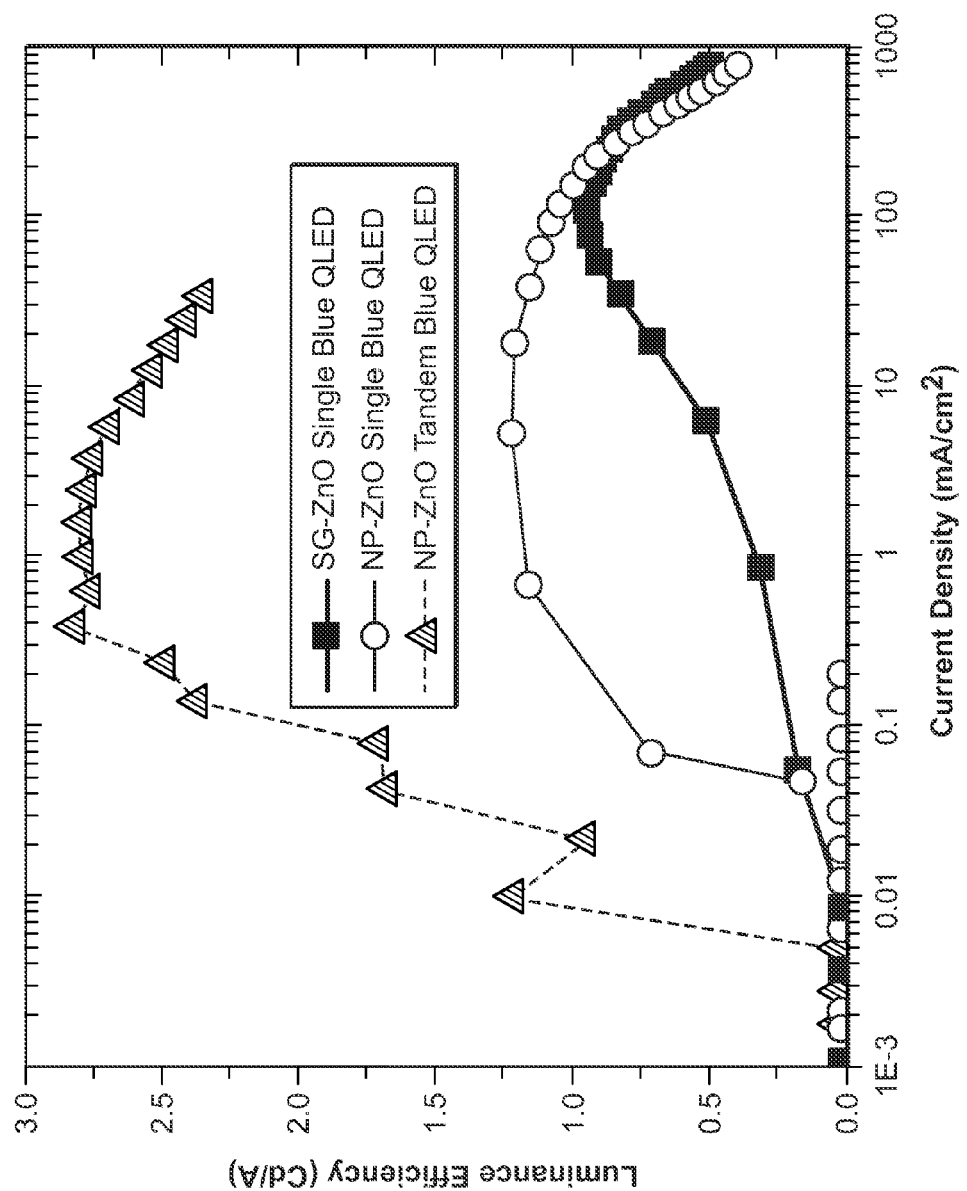
FIG. 3 provides a graphical representation of candelas/ amp as a function of current density for two separate single devices and for an example of an embodiment of tandem device in accordance with the present invention.
Figure 4:
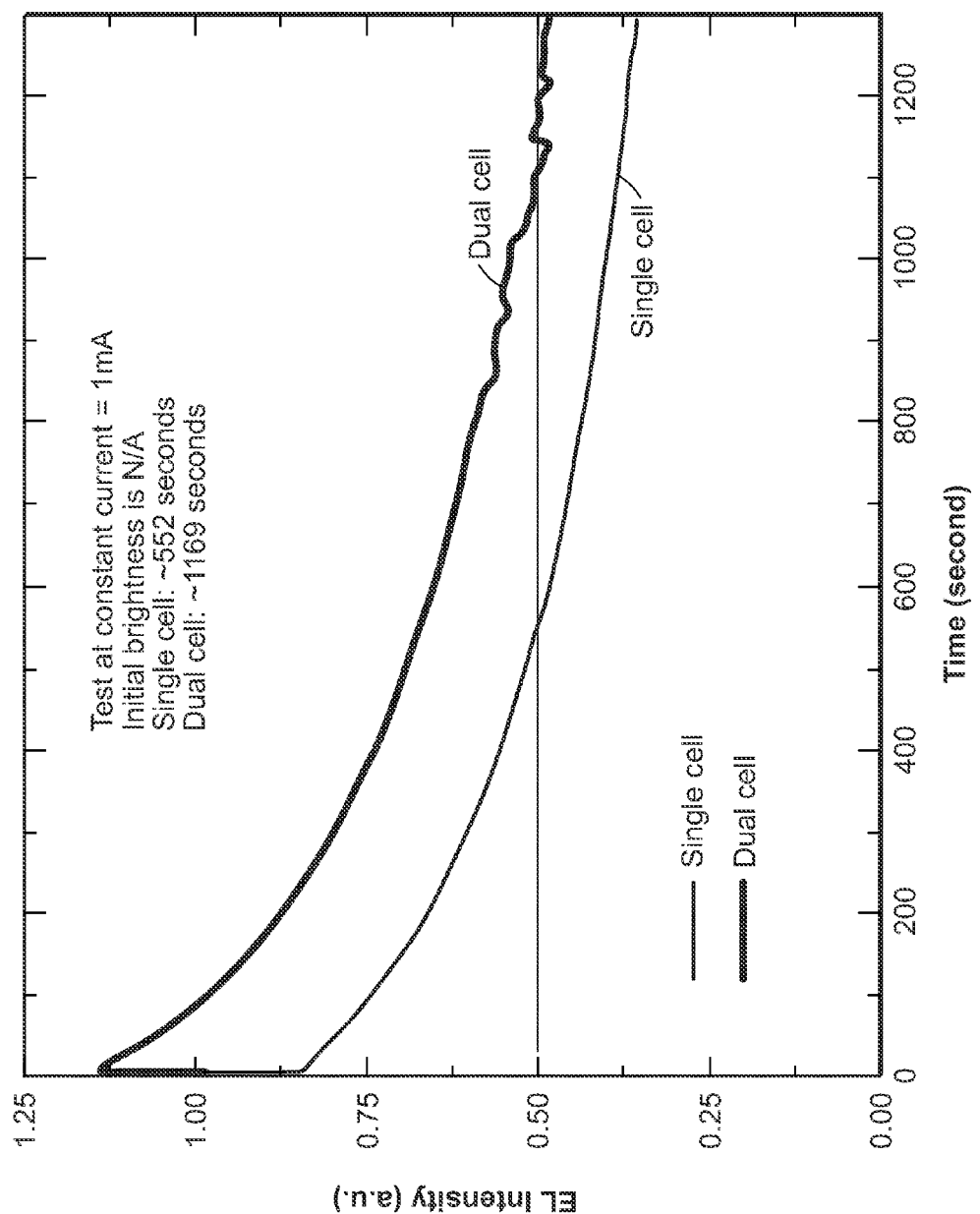
FIG. 4 provides a graphical representation of electroluminescent intensity (in arbitrary units) as a function of time for a single cell device and for an example of an embodiment of tandem device in accordance with the present invention.

FIGS. 2-4 show the results for two devices prepared generally described in Section D above: the curve labeled "NP—ZnO Single Blue QLED" corresponding to a device prepared generally as described in paragraph D(1) and the curve labeled "NP—ZnO Tandem Blue QLED" corresponding to a device prepared generally as described in paragraph D(2). The other curve labeled "SG ZnO Single Blue QLED" corresponds to a single device including a structure similar to that of the device of paragraph D(1) but including a ZnO layer prepared by a sol-gel process instead of ZnO nanoparticles.

The data in FIG. 2 indicates that a tandem device in accordance with the invention can have similar power luminous efficiency to a single cell device.

The data in FIG. 3 indicates that a device in accordance with the invention can have improved luminance efficiency (Cd/A) compared to a single cell device.

The data in FIG. 4 indicates that a device in accordance with the invention can have improved electroluminescent lifetime.

Such tandem devices, however, can also have higher operational voltage than a single cell device and may experience a higher turn-on voltage than a single cell device.

Other materials, techniques, methods, applications, and information that may be useful with the present invention are described in: International Application No. PCT/US2007/013152, filed 4 Jun. 2007, of Coe-Sullivan, et al., entitled "Light-Emitting Devices And Displays With Improved Performance"; International Application No. PCT/US2010/056397 of Kazlas, et al., filed 11 Nov. 2010, entitled "Device Including Quantum Dots", International Application No. PCT/US2008/013504, filed 8 Dec. 2008, entitled "Flexible Devices Including Semiconductor Nanocrystals, Arrays, and Methods", of Kazlas, et al., which published as WO2009/099425 on 13 Aug. 2009, International Application No. PCT/US2007/008873, filed 9 Apr. 2007, of Coe-Sullivan et al., entitled "Composition Including Material, Methods Of Depositing Material, Articles Including Same And Systems For Depositing Material", International Application No. PCT/US2008/010651, filed 12 Sep. 2008, of Breen, et al., entitled "Functionalized Nanoparticles And Method", International Application No. PCT/US2009/004345, filed 28 Jul. 2009 of Breen et al., entitled "Nanoparticle Including Multi-Functional Ligand And Method", U.S. application Ser. No. 12/283,609, filed 12 Sep. 2008 of Coe-Sullivan, et al., entitled "Compositions, Optical Component, System Including An Optical Component, Devices, And Other Products", and International Application No. PCT/US2009/002789 of Coe-Sullivan et al, filed 6 May 2009, entitled "Solid State Lighting Devices Including Quantum Confined Semiconductor Nanoparticles, An Optical Component For A Solid State Light Device, And Methods", each of the foregoing being hereby incorporated herein by reference in its entirety.

It will be understood that when an element or layer is referred to as being "over" another element or layer, the element or layer can be directly on or connected to another element or layer or there can be intervening elements or layers. As used herein, the term "and/or" includes any and all combinations of one or more of the associated listed items.

As used herein, the singular forms "a," "an" and "the" are intended to include the plural forms as well, unless the context clearly indicates otherwise. The terms "comprises" and/or "comprising," or "includes" and/or "including" when used in this specification, specify the presence of stated features, regions, integers, steps, operations, elements and/or components, but do not preclude the presence or addition of one or more other features, regions, integers, steps, operations, elements, components and/or groups thereof.

It will be understood that, although the terms first, second, third, etc., can be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the exemplary embodiments of the invention.

The entire contents of all patent publications and other publications cited in this disclosure are hereby incorporated herein by reference in their entirety. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A light emitting device comprising:
   a pair of electrodes;
   two or more light emitting elements disposed between the electrodes in a stacked arrangement, wherein each of the two or more light emitting elements comprises a layer comprising an emissive material, wherein the emissive material included in each of the two or more light emitting elements comprises quantum dots, and wherein the layers included in the two or more light emitting elements emit light of a same color; and a charge generation element disposed between adjacent light emitting elements in the stacked arrangement, the charge generation element comprising a first layer comprising nanoparticles of an inorganic n-type semiconductor material and a second layer comprising a hole injection material; where the nanoparticles of the inorganic n-type semiconductor material are in direct contact with at least one layer of the emissive material.

2. The light emitting device in accordance with claim 1 wherein the light emitting device is encapsulated.

3. The light emitting device in accordance with claim 1 wherein the quantum dots included in the at least one of the light emitting elements have a monodisperse size distribution.

4. The light emitting device in accordance with claim 3 wherein at least one of the other light emitting elements includes an emissive material comprising an organic electroluminescent material.

5. The light emitting device in accordance with claim 1 wherein the emissive material included in each of the light emitting elements comprises quantum dots with a monodisperse size distribution.

6. The light emitting device in accordance with claim 1 wherein the inorganic n-type semiconductor material comprises a Group II-VI compound, a Group III-V compound, a Group IV-VI compound, a Group compound, a Group II-IV-VI compound, a Group II-IV-V compound, a Group IV element, an alloy including any of the foregoing and/or a mixture including any of the foregoing.

7. The light emitting device in accordance with claim 1 wherein the nanoparticles of the inorganic n-type semiconductor material include non-light emitting nanoparticles of the inorganic n-type semiconductor material.

8. The light emitting device in accordance with claim 1 wherein the nanoparticles are not surface passivated.

9. The light emitting device in accordance with claim 1 wherein the nanoparticles of the inorganic n-type semiconductor material include n-type zinc oxide nanoparticles.

10. The light emitting device in accordance with claim 1 wherein the hole injection material comprises an organic material without an inorganic dopant.

11. The light emitting device in accordance with claim 1 wherein the first layer comprising the nanoparticles of the inorganic n-type semiconductor material injects electrons into the contiguous light emitting element and the second layer comprising a hole injection material inject holes into the contiguous light emitting element.

12. The light emitting device in accordance with claim 1 wherein at least one of the light emitting elements further comprises one or more additional layers.

13. The light emitting device in accordance with claim 1 wherein at least one of the light emitting elements comprises:

a first layer comprising a charge transport material; and a second layer comprising the emissive layer.

14. The light emitting device in accordance with claim 13 wherein each of the at least one of the light emitting elements further comprises a third layer comprising a second charge transport material on a side of the second layer opposite the first layer.

15. The light emitting device in accordance with claim 1 wherein the charge generation element is at least 80% transparent to light passage.

16. The light emitting device in accordance with claim 1 wherein the emissive layer comprising quantum dots is contiguous to the first layer of the charge generation element.

17. The light emitting device in accordance with claim 1 wherein the light emitting element contiguous to the second layer of the charge generation element includes a layer comprising a hole transport material between the emissive layer and the second layer.

* * * * *